United States Patent
Fachmann et al.

(10) Patent No.: US 12,525,499 B2
(45) Date of Patent: Jan. 13, 2026

(54) METHOD OF MANUFACTURING SEMICONDUCTOR CHIPS HAVING A SIDE WALL SEALING

(71) Applicant: Infineon Technologies Austria AG, Villach (AT)

(72) Inventors: Christian Fachmann, Fürnitz (AT); Ingo Muri, Villach (AT)

(73) Assignee: Infineon Technologies Austria AG, Villach (AT)

( * ) Notice: Subject to any disclaimer, the term of this patent is extended or adjusted under 35 U.S.C. 154(b) by 755 days.

(21) Appl. No.: 17/620,342

(22) PCT Filed: Jun. 18, 2020

(86) PCT No.: PCT/EP2020/066969
§ 371 (c)(1),
(2) Date: Dec. 17, 2021

(87) PCT Pub. No.: WO2020/254499
PCT Pub. Date: Dec. 24, 2020

(65) Prior Publication Data
US 2022/0352048 A1 Nov. 3, 2022

(30) Foreign Application Priority Data

Jun. 21, 2019 (EP) ..................... 19181723

(51) Int. Cl.
*H01L 23/31* (2006.01)
*H01L 21/02* (2006.01)
(Continued)

(52) U.S. Cl.
CPC .... *H01L 23/3185* (2013.01); *H01L 21/02258* (2013.01); *H01L 21/3043* (2013.01); *H01L 21/78* (2013.01); *H01L 23/3114* (2013.01)

(58) Field of Classification Search
CPC .......... H01L 23/3185; H01L 21/02258; H01L 21/3043; H01L 21/78; H01L 23/3114;
(Continued)

(56) References Cited

U.S. PATENT DOCUMENTS 6,551,944 B1 * 4/2003 Fallica .............. H01L 21/76232
257/E21.549
2009/0227070 A1 9/2009 Miyajima
(Continued)

FOREIGN PATENT DOCUMENTS

| CN | 106549015 A | 3/2017 |
| EP | 0226091 A2 | 6/1987 |
| EP | 0996147 A1 | 4/2000 |

OTHER PUBLICATIONS

IBM Technical Disclosure Bulletin: "Semiconductor Chip Insulation by Anodic Oxidation", Nov. 1, 1964, vol. 7, NR 6, pp. 528-529.

*Primary Examiner* — Thanh T Nguyen
(74) *Attorney, Agent, or Firm* — Murphy, Bilak & Homiller, PLLC

(57) ABSTRACT

A method of manufacturing semiconductor chips having a side wall sealing is described. The method includes forming dicing trenches in a semiconductor wafer. The side walls of the dicing trenches are anodized to generate an anodic oxide layer at the side walls of the dicing trenches. Semiconductor chips are separated from the semiconductor wafer.

11 Claims, 4 Drawing Sheets

(51) Int. Cl.
*H01L 21/304* (2006.01)
*H01L 21/78* (2006.01)

(58) Field of Classification Search
CPC ... H01L 2221/68327; H01L 2221/6834; H01L 21/561; H01L 21/6835; H01L 2224/0401; H01L 21/306; C25D 11/32; H10N 70/063; H10N 70/043; H10N 70/245; H10N 70/826; H10N 70/882; H10N 70/24; H10B 63/84; H10B 63/20; H10D 84/00; H10D 89/10
See application file for complete search history.

(56) References Cited

U.S. PATENT DOCUMENTS

| | | |
|---|---|---|
| 2009/0243097 A1 | 10/2009 | Koroku et al. |
| 2012/0034760 A1 | 2/2012 | Schuderer et al. |
| 2013/0224910 A1 | 8/2013 | Shi et al. |
| 2015/0162192 A1* | 6/2015 | Schulze ............ H01L 29/66477 438/771 |
| 2015/0162418 A1* | 6/2015 | Meiser ................ H10D 62/111 438/459 |
| 2017/0263719 A1 | 9/2017 | Schulze et al. |
| 2020/0258751 A1* | 8/2020 | Seddon ................ H01L 21/561 |

* cited by examiner

US 12,525,499 B2

METHOD OF MANUFACTURING SEMICONDUCTOR CHIPS HAVING A SIDE WALL SEALING

TECHNICAL FIELD

The disclosure relates to the field of semiconductor chip manufacturing, and in particular to side wall sealing of semiconductor chips.

BACKGROUND

Side walls of semiconductor chips are prone to mechanical and chemical damage during and after separating the semiconductor chips from the semiconductor wafer. In particular, metal plating and/or soldering processes applied after chip separation (e.g. during packaging) may have a negative impact on chip side wall integrity and may, e.g., cause chip-cracks.

SUMMARY

According to an aspect of the disclosure, a method of manufacturing semiconductor chips having a side wall sealing includes forming dicing trenches in a semiconductor wafer. The side walls of the dicing trenches are anodized to generate an anodic oxide layer at the side walls of the dicing trenches. The semiconductor chips are separated from the semiconductor wafer.

According to an aspect of the disclosure, a semiconductor chip comprises an anodic oxide layer at its side walls.

DETAILED DESCRIPTION

It is to be understood that the features of the various exemplary embodiments and examples described herein may be combined with each other, unless specifically noted otherwise.

Wafer dicing is a process to singularize a semiconductor wafer into chips, also referred to as dies in the art. Various techniques have been developed for wafer dicing. In particular the manufacturing of thin chips destined for, e.g., power applications from semiconductor wafers is a challenging task. Conventional dicing methods typically produce unprotected chip edges and may further cause chipping at the edges (side walls) of the separated chips.

Figure 1:
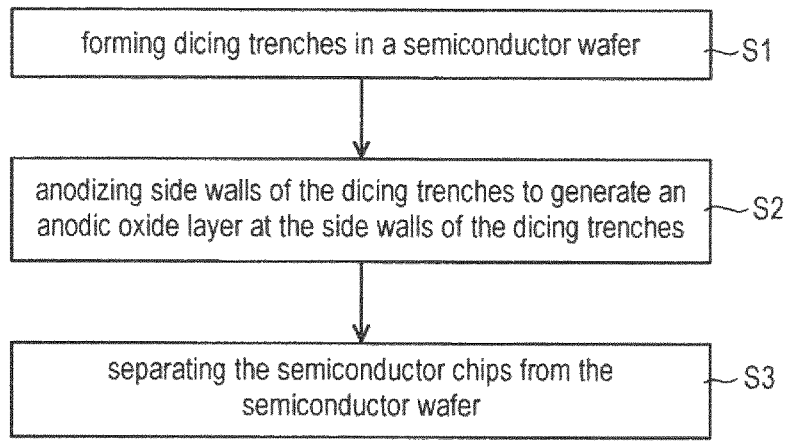
FIG. 1 is a flowchart schematically illustrating an exemplary method of manufacturing semiconductor chips having an anodic oxide layer as a side wall sealing.

Referring to FIG. 1, a method of manufacturing semiconductor chips having a side wall sealing is described by way of example. At S1 dicing trenches are formed in a semiconductor wafer. The dicing trenches may, e.g., be formed mechanically, e.g. by blade dicing, chemically, e.g. by etching, and/or by laser beam ablation.

At S2 the side walls of the dicing trenches are anodized to generate an anodic oxide layer at the side walls of the dicing trenches. Anodizing the side walls produces the side wall sealing. As will be described further below, the side wall sealing produced by such electrochemical process has a high quality in terms of uniformity, conformity, and sealing capability.

At S3 the semiconductor chips are separated from the semiconductor wafer. Separating the semiconductor chips from the semiconductor wafer may involve various different techniques, e.g. including thinning, laser-separation, etc.

Figure 2:
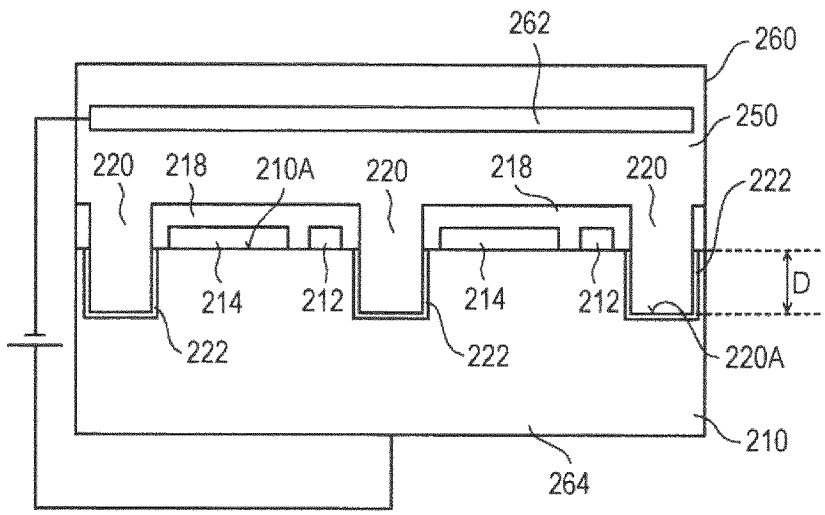
FIG. 2 is a schematic illustration of a process of anodizing side walls of dicing trenches to generate an anodic oxide layer at the side walls.

Referring to FIG. 2, the process of anodizing the side walls of dicing trenches at S2 is described in more detail by way of example. In FIG. 2 a semiconductor wafer 210 (of which only a portion is shown in FIG. 2) is immersed in an electrolyte 250 contained in an electrolytic cell 260. The electrolytic cell 260 further contains a cathode 262 (negative electrode) and an anode 264 (positive electrode), whereat the semiconductor wafer 210 is acting as the anode 264.

As already mentioned, dicing trenches 220 have been formed in the semiconductor wafer 210 before carrying out the anodizing process. The dicing trenches 220 may have a depth D (as measured between an upper surface 210A of the semiconductor wafer 210 and a bottom surface 220A of the dicing trench 220) of equal to or less than 50 μm, 70 μm, 90 μm, 110 μm, 130 μm, or 150 μm. In particular, D may be equal to or greater than the thickness of the semiconductor chips to be produced from the semiconductor wafer 210.

The semiconductor wafer 210 may be front-end processed, i.e. integrated circuits (not shown) may be monolithically integrated in each of the semiconductor wafer regions bordered by the dicing trenches 220. The integrated circuits (IC) may represent power ICs. In particular the ICs may comprise or represent power transistors, power diodes, etc.

Electrodes such as, e.g., a gate electrode 212 and/or a source electrode 214 may be arranged at the upper surface 210A of the semiconductor wafer 210. It is to be noted that the gate and source electrodes 212, 214 depicted in FIG. 2 are merely an example and other electrodes, such as, e.g., a drain electrode and/or electrodes of logic or analog ICs may be provided at the upper surface 210A of the semiconductor wafer 210.

In the example shown in FIG. 2, the electrode(s) (e.g. gate and source electrodes 212, 214) is (are) covered by a mask material 218, e.g. a photoresist.

The mask material 218 may cover surface areas of the semiconductor wafer 210 which are intended not to be exposed to the electrochemical anodizing process. In the example shown in FIG. 2, the mask material 218 completely covers the upper surface 210A of the semiconductor wafer 210 laterally outside of the dicing trenches 220 and may completely cover the electrode(s) (e.g. gate and source electrodes 212, 214) at the upper surface 210A of the semiconductor wafer 210. However, as will be described in more detail further below, it is also possible that the layer of mask material 218 ends at a certain offset from the rim of the dicing trenches 220 so as to provide for a frame-shaped exposed area at the upper surface 210A of the semiconductor wafer 210 adjacent to the rim of the dicing trenches 220.

Apart from covering the upper surface 210A and the electrodes during the anodizing process, the mask material 218 may have one or more further functions. According to a first possibility, a mask layer of mask material 218 may be generated over the semiconductor wafer 210 before forming the dicing trenches 220. The mask layer may then be patterned to expose dicing trench streets on the semiconductor wafer 210. The dicing trenches 220 may then be formed by plasma dicing using the patterned mask layer. In this case, the patterned mask layer may also act as a dicing mask.

For instance, plasma dicing may be performed by deep reactive ion etching (DRIE). DRIE is a dry plasma process which can etch very narrow, deep vertical dicing trenches 220 into the semiconductor wafer 210.

According to a second possibility, a mask layer of mask material 218 may be generated over the semiconductor wafer 210 after forming the dicing trenches 220. The mask layer may then be patterned to expose at least the dicing trenches 220. As mentioned, it is also possible that the mask layer is patterned to additionally expose a frame-like area of the upper surface 210A of the semiconductor wafer adjacent to the dicing trenches 220. The patterned mask layer is then used to anodize all exposed surfaces of the semiconductor wafer 210 which are not covered by the patterned mask layer. That is, the side walls of the dicing trenches 220 and optionally the frame-like areas adjacent dicing trenches 220 are anodized by using the patterned mask layer.

Returning to FIG. 2, the dicing trenches 220 (which, e.g., may have been produced by half-cut blade dicing or plasma dicing) are then anodized to generate an anodic oxide layer 222. The anodic oxide layer 222 may partly or completely cover the side walls of the dicing trenches 220.

The anodic oxide layer 222 is generated by anodic oxidation of the wafer material. The wafer material may, e.g., be silicon (Si) or other materials such as SiGe, SiC, etc. In the following, without loss of generality and merely for ease of explanation, Si is used as an example for the semiconductor wafer material.

During anodic oxidation, Si—Si bonds of the Si semiconductor wafer 210 are broken and replaced by Si—O bonds. The following chemical equation may describe the anodizing of Si:

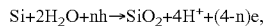

$$Si + 2H_2O + nh \rightarrow SiO_2 + 4H^+ + (4-n)e,$$

where h denotes holes, e denotes an electron, and n is an integer.

That is, the direct current applied between the cathode 262 and the anode 264 passes through the electrolyte 250 and releases hydrogen at the cathode 262 and oxygen at the exposed upper surface 210A of the semiconductor wafer 210 (i.e. at the anode 264). The oxygen creates a build-up of silicon oxide, namely the anodic oxide layer 222. Further, it appears from the chemical equation that anodic oxidation is a hole-driven process.

The electrolyte 250 contains water, i.e. is an aqueous solution. In aqueous solutions the anodizing process does not much depend on the dissolved salts in the electrolyte 250. Therefore, a variety of different electrolytes 250 may be used, in particular deionized water, $HNO_3$, $H_3PO_4$, $NH_4OH$, etc.

It is to be noted that the anodic oxide layer 222 generated by electrochemical anodizing is different in structure from semiconductor oxide layers produced by deposition processes such as, e.g., by pyrolysis of silane, TEOS (tetraethyl orthosilicate) deposition, or LTO (low temperature oxide) deposition. Anodic oxide has a higher density than deposited oxide. Further, the generation process is self-adjusting and highly conformal. This guarantees that the exposed surfaces of the semiconductor wafer 210 (and in particular the side walls of the dicing trenches 220) are completely and hermetically sealed without any defects or weak points in the anodic oxide layer 222. Briefly put, the anodized oxide layer 222 is different in structure and better in quality than deposited oxide layers.

Further it is to be noted that high temperature oxide generation processes cannot be used to seal the side walls of the dicing trenches 220 since the semiconductor wafer 210 can no more be heated to high temperatures at that late stage of wafer processing (i.e. after wafer metallization).

Another advantage of anodic oxide over deposited oxide is that anodic oxide is generated selectively, while deposited oxide fully coats the semiconductor wafer 210.

Figure 3:
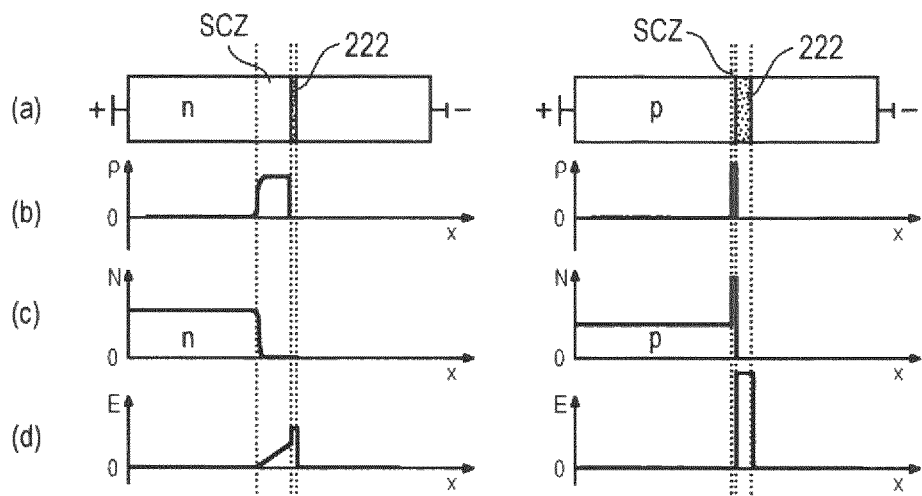
FIG. 3 is a schematic illustration of a metal-oxide-semiconductor (MOS) structure during anodic oxidation for an n-type semiconductor (left side) and a p-type semiconductor (right side) in view of (a) a space charge zone (SCZ), (b) the space charge density ρ, (c) the charge carrier concentration N of negative and positive charge carriers (i.e. Nn of electrons and Np of holes), and (d) the electrical field E.

FIG. 3 schematically illustrates characteristics of the generation of the anodic oxide layer 222 in the electrolytic cell 260. The left side diagrams in FIG. 3 relate to an n-type semiconductor wafer 210, while the right side diagrams relate to a p-type semiconductor wafer 210. Referring to an n-type semiconductor wafer 210, given the semiconductor wafer 210 does not have a very high dopant concentration of, e.g., equal to or less than about $10^{18}$ cm$^{-3}$ or $10^{19}$ cm$^{-3}$, the anodic oxide layer 222 defines a metal-oxide-semiconductor (MOS) structure during anodic oxidation, with the electrolyte representing the metal. After the generation of an initial layer thickness of a few nm of the anodic oxide layer 222, a space charge zone (SCZ) is generated in the n-type semiconductor wafer 210 (see (a) and (b) of the left portion of FIG. 3), which inhibits further oxidation even if the voltage is increased. Only upon reaching the breakdown voltage, further anodic oxide is generated, however, by an uncontrolled process. Therefore, unlike the case of a p-type semiconductor wafer 210 (see (a) and (b) of the right portion of FIG. 3) where virtually no SCZ is formed upon initial anodic oxide layer generation, it is difficult to produce anodic oxide layers 222 of greater thickness in n-type semiconductor wafers 210 having a dopant concentration of, e.g., equal to or less than about $10^{18}$ cm$^{-3}$ or $10^{19}$ cm$^{-3}$ by anodic oxidation.

The electrochemically generated anodic oxide acts as an insulator between the applied voltage. During the anodizing process, the thinner the anodic oxide layer 222 is at a specific location, the higher is the electrical field E at that location. As a result, thinner areas of the anodic oxide layer 222 are more strongly anodized, since the process is controlled by the electrical field-driven movement of ions. This self-adjustment of the anodizing process provides for a high conformity (e.g. in thickness and/or structure) of the generated anodic oxide layer 222, which is even better than the conformity of thermal oxides which are generated by a diffusion controlled reaction.

Approaches to produce thicker anodic oxide layers 222 in n-type semiconductor wafers 210 which do not have a very high dopant concentration are described below.

Figure 4:
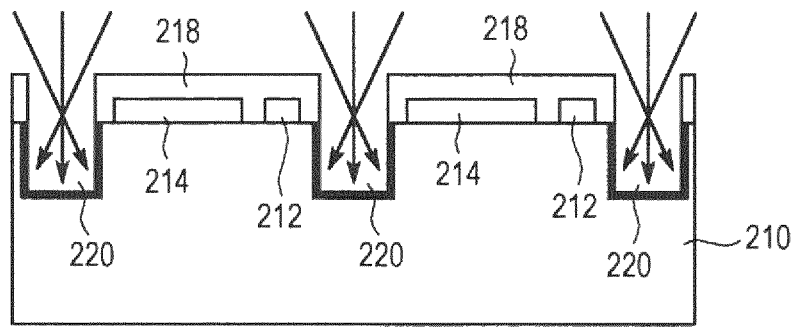
FIG. 4 is a schematic illustration of a process of implanting an n-type dopant or a p-type dopant into the side walls of the dicing trenches before anodizing.

According to a first approach, the anodic oxide layer formation process may be boosted by implanting an n-type dopant or a p-type dopant into the side walls of the dicing trenches 220 before anodizing. This approach is illustrated in FIG. 4. The arrows indicate a shallow implantation of a donor (e.g. phosphor, arsenic, antimony, etc.) in the side walls of the dicing trenches 220. The dopant inhibits the formation of a SCZ and thereby allows further anodic oxide growth. An acceptor such as, e.g. boron, may also be used as a p-type dopant.

As it is no more possible to activate the dopants at high temperature, the concentration of the dopants (i.e. the implantation dose) should be relatively high.

Alternatively or in addition, thermal donors may be induced by hydrogen implantation. An advantage of thermal donors is that temperatures of only about 400° C. are sufficient for activation. Such temperatures are compliant with wafer processing at that stage of wafer fabrication, in particular with the front side metallization (electrodes 212, 214) which may have already been applied to the semiconductor wafer 210. Thus, hydrogen implantation (which may also be indicated by the arrows of FIG. 4) may be followed by an annealing process at modest temperatures of, e.g., about 400° C.

As shown in FIG. 4, the mask material 218 (which may or may not have been previously used for trench dicing) may be used as an implantation mask for one or more of the implantation processes described above. The thickness of the mask layer of mask material 218 may be equal to or more than a few 10 µm. Such mask layer thickness is sufficient for plasma dicing and is also sufficient for acting as an implantation mask layer during the implantation process.

The implantation of an n-type dopant or a p-type dopant or hydrogen into the side walls of the dicing trenches 220 may not only allow further anodic oxide layer generation, but could, in addition, serve as a field stop region at the semiconductor chip edge. As known in the art, semiconductor chips and, in particular, power semiconductor chips are equipped with a field stop region in order to prevent the generation of an electrical field at the chip edge. Thus, the mask layer of the mask material 218 may also be used as the implantation mask for generating the lateral field stop region, thereby avoiding the application of separate masks and further lithography for generating the field stop region.

According to a second approach, the generation of a SCZ in an n-type semiconductor wafer 210 could be inhibited by illuminating the side walls of the dicing trenches 220 during anodizing. In an n-type semiconductor wafer 210, the oxidation rate will be sensitive to illumination because holes are the minority carrier. Illumination does not affect the oxidation rate when a p-type semiconductor wafer 210 is used.

Figure 5:
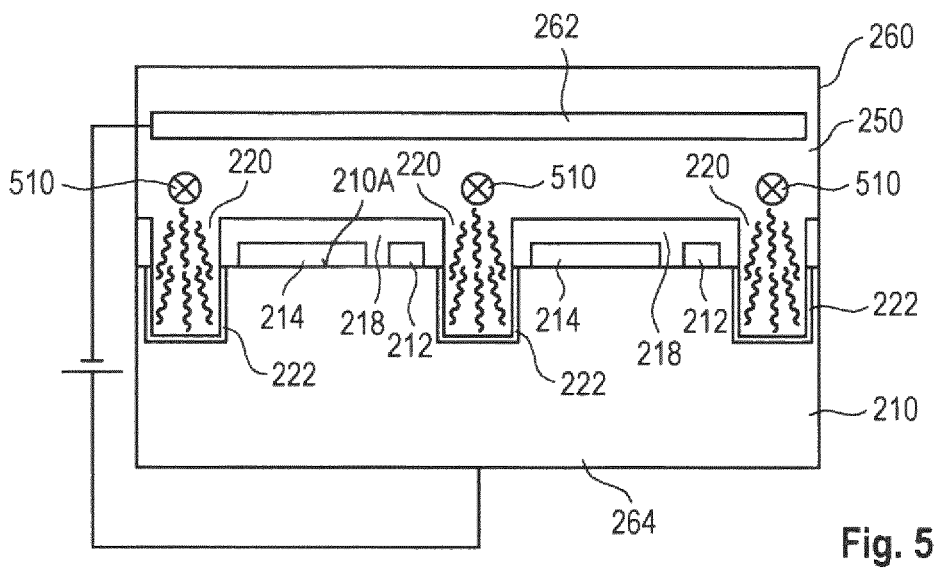
FIG. 5 is a schematic illustration of a process of illuminating the side walls of the dicing trenches during anodizing.

Referring to FIG. 5, one or more light sources 510 may be accommodated in the electrolytic cell 260. The light source (s) is (are) configured to completely illuminate the side walls of the dicing trenches 220, thereby generating electron-hole pairs in the semiconductor wafer 210 in a region adjacent to the side walls. The electron-hole pairs are generated by the photons emitted by the light source(s) and have the effect that the electrical field E is not depleted by the SCZ (compare with left side diagram (d) of FIG. 3 where the electrical field E is depleted by the SCZ without illumination). This allows the generation of anodic oxide layers 222 in n-type doped semiconductor material having a limited dopant concentration of a similar thickness than in p-type semiconductor material or than in n-type semiconductor material of a very high dopant concentration.

The light source(s) 510 may be arranged under a short distance above the upper surface 210A of the semiconductor wafer 210. The light source(s) 510 may be realized, e.g., by a diode array or any other light emitting device, e.g. by a light emitting foil or by an array of light emitting devices.

In FIG. 5 the light source(s) 510 is (are) located between the cathode 262 and the semiconductor wafer 210. However, it is also possible that the light source(s) 510 is (are) arranged above the cathode 262, which then may be transparent (e.g. may be formed by a transparent electrically conductive foil or by an electrically conductive mesh).

Though described for the example of n-type semiconductor wafers 210 which do not have a very high dopant concentration, the first approach and second approach may, e.g., be applied in general to all semiconductor wafers.

Further, it has been found that anodic oxide layers 222 of sufficient thickness can be formed on damaged surfaces of a semiconductor wafer 210, e.g. on a silicon surface that was damaged during the wafer sawing process by, e.g., blade dicing for producing the dicing trenches 220. In this case, no implantation and/or illumination processes are needed for the generation of an anodic oxide layer 222 of sufficient thickness. The generation of an anodic oxide layer 222 of sufficient thickness on damaged surfaces is also possible even for undoped (i.e. intrinsic) semiconductor wafers 210. In all cases it is possible to combine blade dicing (which produces damaged trench side walls) and the aforementioned implantation and/or illumination processes.

Further, it has been found that for all anodizing processes described herein the temperature during the anodizing treatment plays an important role for the structural quality of the generated anodic oxide layer 222. More specifically, at a temperature of the electrolyte 250 of equal to or higher than 70° C. or 80° C. or 90° C., the anodizing process provides for a fully closed and sealed anodic oxide layer 222 which allows for high quality side wall sealing, while the anodic oxide layer 222 may become increasingly porous at electrolyte temperatures lower than 70° C.

Throughout this description, the anodic oxide layer 222 may have a thickness of equal to or greater than 5 nm, 10 nm, 20 nm, 50 nm, 100 nm, 0.5 µm, 1.0 µm, or 2.0 µm. The anodic oxide layer 222 may comprise or be of $SiO_2$ or another oxide composition generated by anodizing the semiconductor bulk material of the semiconductor wafer 210 at the side walls of the dicing trenches 220.

Figure 6:
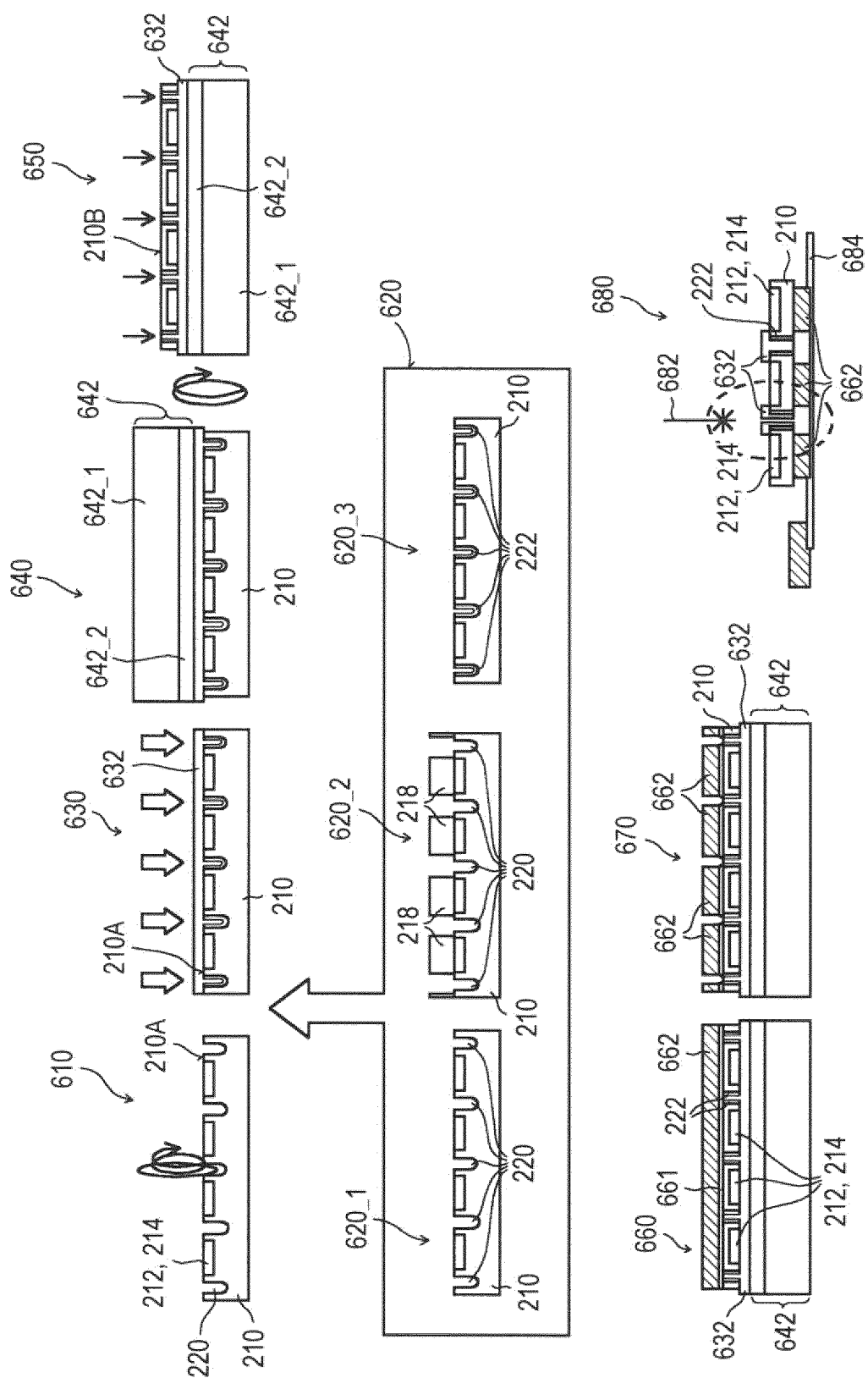
FIG. 6 is an illustration of exemplary processes which could be used in the method of manufacturing semiconductor chips having an anodic oxide layer as a side wall sealing.

FIG. 6 illustrates exemplary processes which could be used in a method of manufacturing semiconductor chips having an anodic oxide layer 222 as a side wall sealing. At 610 a so-called half-cut dicing (e.g. blade dicing or plasma-dicing) is carried out. Dicing trenches 220 and optional electrode(s) 212, 214 are depicted in FIG. 6.

Subsequently, at 620 the side walls of the dicing trenches 220 are anodized. To build-up the anodic oxide layer 222, any of the aforementioned processes may be used. Briefly, at 620_1 the half-cut diced semiconductor wafer 210 is illustrated (as it is already shown at 610). At 620_2 a mask layer of mask material 218 was generated over the semiconductor wafer 210 and had then been patterned to expose the dicing trenches 220. In the example shown in FIG. 6, not only the dicing trenches 220 are exposed but also a certain frame-like surface area of the semiconductor wafer 210 adjacent to the dicing trenches 220. The patterned mask layer may completely cover the electrode(s) 212, 214 (or, in general, the metallization) on the semiconductor wafer 210. The process shown at 620_2 may also be referred to as "lithography on kerf". As mentioned above, the patterned mask layer of mask material 218 may further be used as an implantation mask.

At 620_3 the side walls of the dicing trenches 220 are anodized and the anodic oxide layers 222 at the side walls of the dicing trenches 220 are formed. Any of the above specified methods could be used. Further to 620_3 the mask material 218 may then be removed.

It is to be noted that the exemplary processes 620_1, 620_2, 620_3 shown at 620 may be replaced or supplemented by any of the aforementioned processes and variations thereof to arrive at a semiconductor wafer 210 with dicing trenches 220 having side walls which are coated by a low temperature anodic oxide layer 222.

At 630 the dicing trenches 220 are (optionally) filled with an organic resin 632. The organic resin 632 may form a continuous layer covering the upper surface 210A of the semiconductor wafer 210. Filling the dicing trenches 220 with organic resin 632 may be followed by carrying out a lithography process on the layer of organic resin 632, if desired.

At 640 the semiconductor wafer 210 may be attached to a temporary carrier 642. The temporary carrier 642 may, e.g., include a holder or support member 642_1 (e.g. a glass plate) and an adhesive film 642_2.

The temporary carrier 642 with the attached semiconductor wafer 210 may then be flipped upside down. At 650 the semiconductor wafer 210 may be thinned at a semiconductor wafer surface 210B opposite the dicing trenches 220, i.e. thinning may be carried out from the backside of the semiconductor wafer 210. Thinning may include grinding and/or etching. The thinning process is illustrated by arrows at 650. As a result of the thinning process, chips embedded in an organic resin matrix are generated. That is, the thinning process may completely separate the semiconductor wafer 210 into single semiconductor chips which are, however, still connected to one another by the organic resin matrix.

The process from 610 to 650 may be referred to as a dicing before grinding (DBG) process.

At 660 an electrode metal material 662 may be deposited on the backside (e.g. on the lower surface 210B) of the semiconductor wafer 210 (which now, however, may also be referred to as an artificial wafer since it may comprise separated semiconductor chips embedded in the organic resin matrix). The deposition of electrode metal material 662 may be carried out by electroless or galvanic plating. By way of example, a Ti/Cu seed layer 661 may be applied to the surface of the (artificial) semiconductor wafer 210 and copper or any other electrode metal may be deposited on the seed layer 661 to provide for the layer of electrode metal material 662.

At 670 the layer of electrode metal material 662 may be structured. Structuring may be accomplished by any available process, e.g. etching.

It is to be noted that the exemplary steps illustrated at 660 and 670 may be replaced or supplemented by other method steps such as, e.g., deposition of solder material over the (artificial) semiconductor wafer 210. In this case, the solder material may be directly deposited (e.g. printed) on the backside of the (artificial) semiconductor wafer 210 to form a patterned electrode metal material layer as shown at 670. For instance, solder materials which are configured for diffusion soldering, such as, e.g., AuSn or other solder materials may be used.

During the application of the electrode metal material 662 and/or solder material at 660, 670, the side walls of the dicing trenches 220 are protected not only by the (optional) organic resin 632 but in addition by the anodic oxide layer 222. While the organic resin 632 typically does not provide for a reliable protection of the side walls of the dicing trenches 220, an effective side wall sealing is obtained by the anodic oxide layer 222. Therefore, the risk of contaminating the side walls of the semiconductor chips by metal (e.g. solder) during or after the process of chip manufacturing is greatly reduced or completely ruled out.

The temporary carrier 642 may then be removed from the (artificial) semiconductor wafer 210. The (artificial) semiconductor wafer 210 may be flipped upside down and placed on a support member 684. A laser beam 682 may be used to separate the (artificial) semiconductor wafer 210 into individual semiconductor chips by organic resin laser separation. At 680 the left side fill of organic resin 632 is shown to be separated by the laser beam 682 while the right side fill of the organic resin 632 is still intact.

Figure 7:
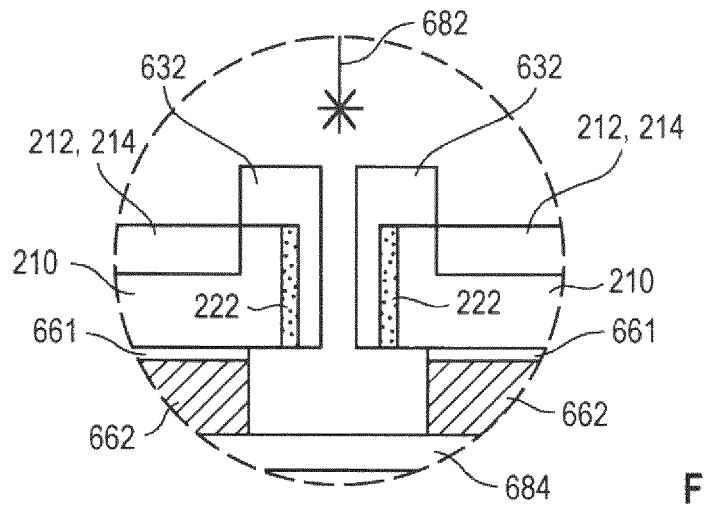
FIG. 7 is a magnified view on an encircled detail in FIG. 6.

FIG. 7 is a magnified view of the encircled detail in FIG. 6 at 680. As apparent from FIG. 7, the semiconductor wafer 210 is now separated in single semiconductor chips comprising an anodic oxide layer 222 side wall protection and an (optional) organic resin 632 side wall protection.

Figure 8:
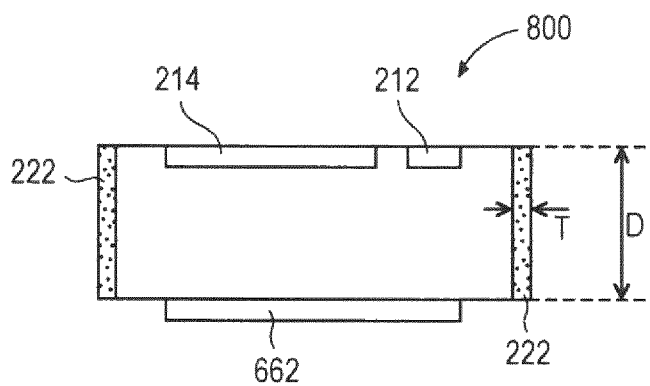
FIG. 8 is a cross sectional view of an exemplary semiconductor chip having an anodic oxide layer at its side walls.

Referring to FIG. 8, an exemplary semiconductor chip 800 comprises an anodic oxide layer 222 at its side walls. The semiconductor chip 800 may be provided with backside electrodes formed by the electrode metal material 662 and/or with front side electrodes (such as, e.g., a gate electrode 212 and/or a source electrode 214). The thickness T of the anodic oxide layer 222 may be equal to or greater than 5 nm, 10 nm, 20 nm, 50 nm, 100 nm, 0.5 µm, 1.0 µm, or 2.0 µm. The thickness D of the semiconductor chip 800 may be equal to or less than 150 µm, 130 µm, 110 µm, 90 µm, 70 µm, or 50 µm. The semiconductor chip 800 may be a power semiconductor chip, e.g. power transistor or power diode.

As shown in FIG. 8, the anodic oxide layer 222 may completely cover the entire surface of the side walls of the semiconductor chip 800.

Figure 9:
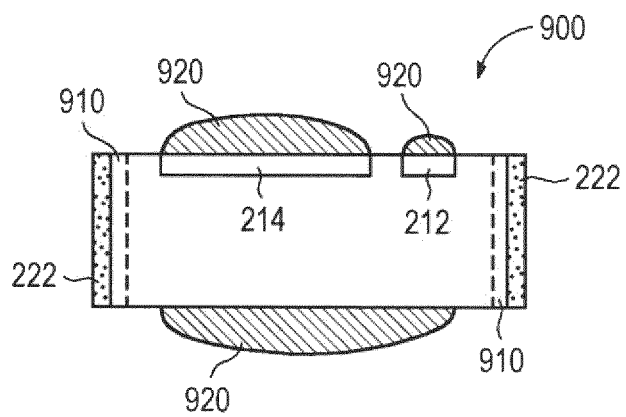
FIG. 9 is a cross sectional view of an exemplary semiconductor chip having an anodic oxide layer at its side walls and solder deposit(s) above its main surface(s).

Referring to FIG. 9, a semiconductor chip 900 may be designed identical to the semiconductor chip 800 except that the semiconductor chip 900 is provided with regions 910 adjacent to the side walls of the semiconductor chip 900 that are n-doped or p-doped. As mentioned previously, n-type dopant implantation and/or p-type dopant implantation at the side walls of the semiconductor chip 900 may provide for a sufficient thickness T of the anodic oxide layer 222 in case of an n-type semiconductor wafer (which does not have a very high dopant concentration) and may, optionally, further be used as a field stop for device fabrication. The regions 910 may also be intrinsic and damaged by blade-cutting.

Further, FIG. 9 illustrates the deposition of solder material 920 over the backside and/or front side of the semiconductor chip 900. The side walls of the semiconductor chip 920 are effectively sealed against solder material contamination during this process or subsequent processes such as, e.g., solder reflow.

The following examples pertain to further aspects of the disclosure:

Example 1 is a method of manufacturing semiconductor chips having a side wall sealing, the method including forming dicing trenches in a semiconductor wafer; anodizing side walls of the dicing trenches to generate an anodic oxide layer at the side walls of the dicing trenches; and separating the semiconductor chips from the semiconductor wafer.

In Example 2, the subject matter of Example 1 can optionally include implanting an n-type dopant or a p-type dopant into the side walls of the dicing trenches before anodizing.

In Example 3, the subject matter of Example 1 or 2 can optionally include implanting hydrogen into the side walls of the dicing trenches before anodizing.

In Example 4, the subject matter of any of the preceding Examples can optionally include illuminating the side walls of the dicing trenches during anodizing.

In Example 5, the subject matter of any of the preceding Examples can optionally include wherein a temperature of an electrolyte during anodizing is equal to or higher than 70° C. or 80° C. or 90° C.

In Example 6, the subject matter of any of the preceding Examples can optionally include wherein separating comprises thinning the semiconductor wafer after anodizing at a semiconductor wafer surface opposite the dicing trenches.

In Example 7, the subject matter of any of the preceding Examples can optionally further include filling the dicing trenches with an organic resin after anodizing.

In Example 8, the subject matter of any of the preceding Examples can optionally further include wherein separating comprises singulating the semiconductor chips by laser cutting through the organic resin.

In Example 9, the subject matter of any of the preceding Examples can optionally include depositing an electrode metal material or a solder material over the semiconductor wafer after anodizing.

In Example 10, the subject matter of any of the preceding Examples can optionally include wherein forming the dicing trenches comprises blade dicing or plasma dicing.

In Example 11, the subject matter of any of the preceding Examples can optionally include generating a mask layer over the semiconductor wafer after forming the dicing trenches; patterning the mask layer to expose the dicing trenches; and anodizing side walls of the dicing trenches by using the patterned mask layer.

In Example 12, the subject matter of any of the Examples 1 to 9 can optionally include generating a mask layer over the semiconductor wafer before forming the dicing trenches; patterning the mask layer to expose dicing trench streets of the semiconductor wafer; forming the dicing trenches by plasma dicing by using the patterned mask layer; and anodizing side walls of the dicing trenches by using the patterned mask layer.

Example 13 is a semiconductor chip, the semiconductor chip comprising an anodic oxide layer at its side walls.

In Example 14, the subject matter of Example 13 can optionally include wherein the anodic oxide layer completely covers the entire surface of the side walls of the semiconductor chip.

In Example 15, the subject matter of Example 13 or 14 can optionally include wherein a thickness of the anodic oxide layer is equal to or greater than 5 nm, 10 nm, 20 nm, 50 nm, 100 nm, 0.5 µm, 1.0 µm, or 2.0 µm.

In Example 16, the subject matter of any one of Examples 13 to 15 can optionally include wherein a region of the semiconductor chip adjacent to the side walls is n-doped or p-doped or intrinsic and damaged by blade-cutting.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of manufacturing semiconductor chips having a side wall sealing, the method comprising:
   forming dicing trenches in a semiconductor wafer;
   anodizing side walls of the dicing trenches to generate an anodic oxide layer at the side walls of the dicing trenches, wherein a temperature of an electrolyte during the anodizing is equal to or higher than 70° C.; and
   separating the semiconductor chips from the semiconductor wafer.

2. The method of claim 1, further comprising:
   implanting an n-type dopant or a p-type dopant into the side walls of the dicing trenches before anodizing.

3. The method of claim 1, further comprising:
   implanting hydrogen into the side walls of the dicing trenches before anodizing.

4. The method of claim 1, further comprising:
   illuminating the side walls of the dicing trenches during anodizing.

5. The method of claim 1, wherein the separating comprises:
   thinning the semiconductor wafer after the anodizing, at a semiconductor wafer surface opposite the dicing trenches.

6. The method of claim 1, further comprising:
   filling the dicing trenches with an organic resin after the anodizing.

7. The method of claim 6, wherein the separating comprises:
   singulating the semiconductor chips by laser cutting through the organic resin.

8. The method of claim 1, further comprising:
   depositing an electrode metal material or a solder material over the semiconductor wafer after the anodizing.

9. The method of claim 1, wherein forming the dicing trenches comprises blade dicing or plasma dicing.

10. The method of claim 1, further comprising:
    generating a mask layer over the semiconductor wafer after forming the dicing trenches; and
    patterning the mask layer to expose the dicing trenches,
    wherein the anodizing of the side walls of the dicing trenches is performed by using the patterned mask layer.

11. The method of claim 1, further comprising:
    generating a mask layer over the semiconductor wafer before forming the dicing trenches; and
    patterning the mask layer to expose dicing trench streets of the semiconductor wafer,
    wherein the dicing trenches are formed by plasma dicing by using the patterned mask layer,
    wherein the anodizing of the side walls of the dicing trenches is performed by using the patterned mask layer.

* * * * *